United States Patent [19]

Tomlinson et al.

[11] Patent Number: 4,562,313
[45] Date of Patent: Dec. 31, 1985

[54] ELECTRICAL SYSTEMS COMPRISING TEMPERATURE-SENSITIVE DEVICES

[75] Inventors: Andrew Tomlinson, Palo Alto; James M. Taylor, Mountain View, both of Calif.

[73] Assignee: Raychem Corporation, Menlo Park, Calif.

[21] Appl. No.: 524,482

[22] Filed: Aug. 18, 1983

[51] Int. Cl.$^4$ .............................................. H04M 1/24
[52] U.S. Cl. ........................... 179/175; 179/175.3 F
[58] Field of Search ............... 179/125.3 R, 175.3 F, 179/175; 361/88, 93, 103, 106

[56] References Cited

U.S. PATENT DOCUMENTS 3,846,674  11/1974  McNulty ............................ 361/106

Primary Examiner—Stafford D. Schreyer
Attorney, Agent, or Firm—Timothy H. P. Richardson; Herbert G. Burkard

[57] ABSTRACT

An electrical system which comprises (1) a temperature-sensitive device comprising a PTC or NTC element, (2) a load in series with the temperature-sensitive device and (3) a control device in parallel with the load and the temperature-sensitive device. The control device is a device whose resistance can be changed from a high value (which may be infinite) to a low value or vice versa, by a change in the electrical or physical environment thereof, e.g. a diode, triac, thyristor, PTC device or NTC device. The system is connected to a power supply so that, under normal conditions of operation, either (a) the temperature-sensitive device has a low resistance and the control device has a high resistance, whereby the load is activated, or (b) the temperature-sensitive device has a high resistance and the control device has a low resistance, whereby the load is isolated. By an appropriate change in the power source, e.g. its size or direction, or in the physical environment of the control device, e.g. its temperature, the relative resistances of the temperature-sensitive device and the control device can be reversed, thereby isolating or activating the load. The system is particularly useful for isolating a remote load, e.g. a telephone, while retaining a continuous circuit e.g. through the legs of a telephone circuit, for example for test purposes.

20 Claims, 6 Drawing Figures

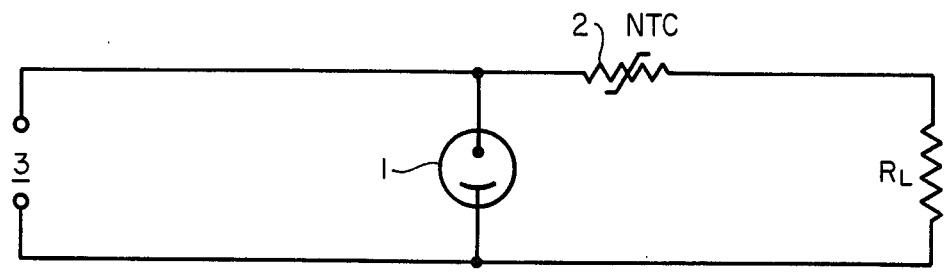
FIG_1
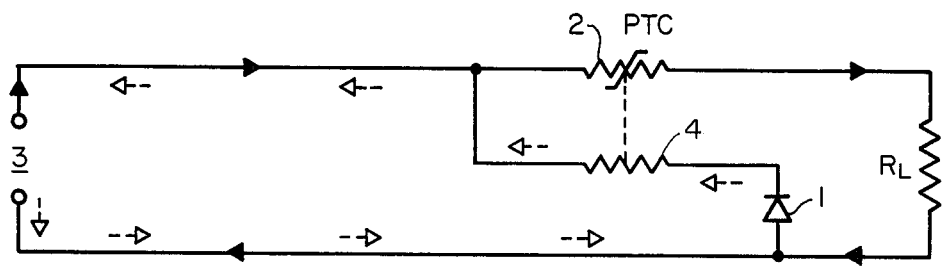
FIG_2
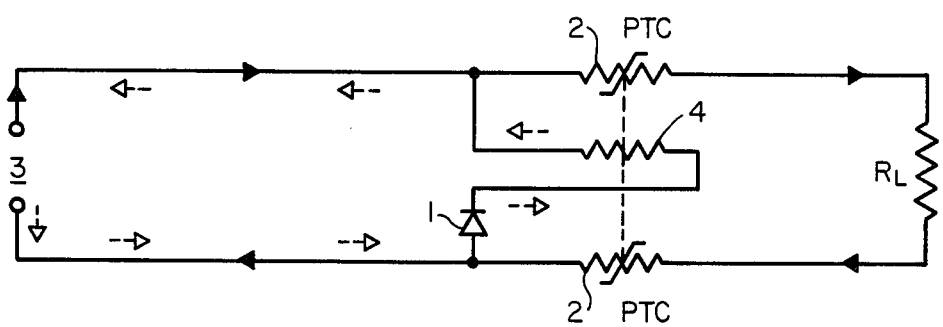
FIG_3

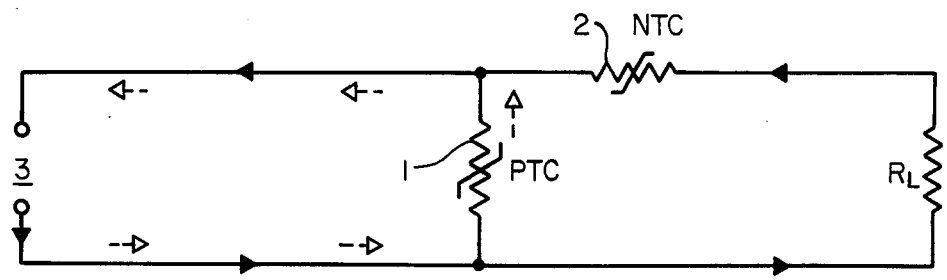
FIG_4
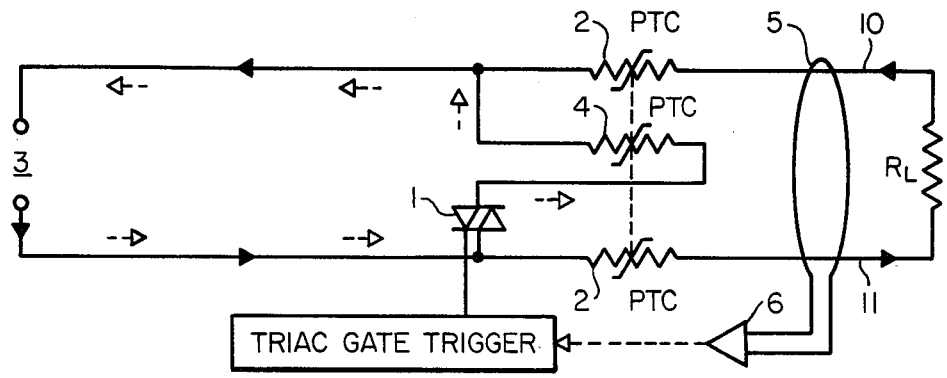
FIG_5
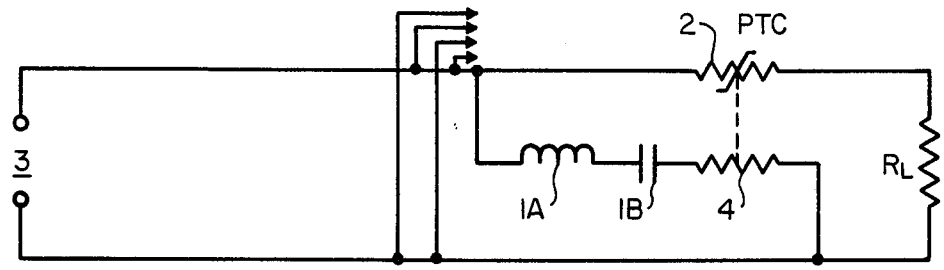
FIG_6

ELECTRICAL SYSTEMS COMPRISING TEMPERATURE-SENSITIVE DEVICES

BACKGROUND OF THE INVENTION

1. Field of the Invention

This invention relates to electrical systems comprising a PTC or NTC device.

2. Summary of the Prior Art

Conductive polymer compositions [including such compositions which exhibit positive temperature coefficient (PTC), zero temperature coefficient (ZTC) or negative temperature coefficient (NTC) behavior] and electrical devices comprising them, including circuit control devices containing PTC elements, are known. Reference may be made for example to U.S. Pat. Nos. 2,978,665 (Vernet et al), 3,243,753 (Kohler), 3,311,862 (Rees), 3,351,882 (Kohler et al), 4,017,715 (Whitney et al), 4,085,286 (Horsma et al), 4,095,044 (Horsma et al), 4,177,376 (Horsma et al) 4,177,446 (Diaz) 4,421,582 (Horsma et al), 4,238,812 (Van Konynenburg et al), 4,255,698 (Simon), 4,276,466 (Middleman et al), 4,272,471 (Walker) 4,445,026 (Walker), 4,304,987 (Van Konynenburg), 4,388,607 (Toy et al), 4,315,237 (Middleman et al), 4,329,726 (Middleman et al), 4,442,139 (Brigham), 4,429,216 (Brigham), 4,413,301 (Middleman et al), 4,314,231 (Walty), 4,352,083 (Middleman et al), 4,317,027 (Middleman et al) 4,314,230 (Cardinal et al) and 4,330,704 (Jensen), and to copending and commonly assigned applications Ser. Nos. 84,352 (Horsma et al), 141,988 (Fouts et al), 141,989 (Evans) and 141,999 (Fouts et al). The disclosure of each of these patents and patent applications is incorporated herein by reference.

Although they suffer from a number of disadvantages by comparison with circuit protection devices comprising conductive polymers, circuit protection devices comprising ceramic PTC materials, e.g. doped barium titanates, are also known. Reference may be made for example to the article entitled "The PTC Resistor" by R. F. Blaha in Proceedings of the Electronic Components Conference, 1971, the disclosure of which is incorporated by reference herein.

SUMMARY OF THE INVENTION

We have now discovered a new way of utilizing a PTC or NTC device to isolate or to activate a load. The new system comprises (1) a temperature-sensitive device comprising a PTC or NTC element, (2) a load in series with the temperature-sensitive device and (3) a control device in parallel with the temperature-sensitive device and the load. The control device is a device whose resistance can be changed from a high value (which may be infinite) to a low value (which may be substantially zero) or vice versa, by a change in the electrical or physical environment thereof, e.g. a diode, traic, thyristor, PTC device or NTC device. [Throughout this specification, the term "resistance" is used to include impedance.] The system is connected to a power supply so that, under normal conditions of operation, either (a) the temperature-sensitive device has a low resistance and the control device has a high resistance, whereby the load is activated, or (b) the temperature-sensitive device has a high resistance and the control device has a low resistance, whereby the load is isolated. By an appropriate change in the power source, e.g. its size or direction, or in the physical environment of the control device, e.g. its temperature, the relative resistances of the temperature-sensitive device and the control device can be reversed, thereby isolating or activating the load. The system is particularly useful for isolating a remote load, e.g. a telephone, while retaining a continuous circuit e.g. through the legs of a telephone circuit, for example for test purposes.

In one aspect the invention provides an electrical circuit which comprises:

(1) a temperature-sensitive device which comprises a PTC element or an NTC element;

(2) a load in series with the temperature-sensitive device; and (3) a control device which
   (a) is in parallel with the temperature-sensitive device and the load, and
   (b) has a resistance which can be changed from a relatively high level to a relatively low level or from a relatively low level to a relatively high level;

the temperature-sensitive device, load and control device being connectable to a source of electrical power to form an electrical system which (A) comprises
   (a) a first circuit which comprises the power source and the control device,
   (b) a second circuit which comprises the power source, the temperature-sensitive device and the load, and
   (c) a third circuit which comprises the temperature-sensitive device, the load and the control device;

(B) is in one of two steady states, namely
   (a) a first state in which the resistance of the control device is at said relatively high level and is substantially higher than the resistance of the temperature-sensitive device and the temperature-sensitive device is in a low resistance state, and
   (b) a second state in which the resistance of the control device is at said relatively low level and is substantially lower than the resistance of the temperature-sensitive device and the temperature-sensitive device is in a high resistance state; and (C) can be converted between the first and second states by changing the power source in the system or changing the physical environment of the control device or both.

In another aspect the invention provides a method of remotely disconnecting telecommunication apparatus located at a location which is remote from an exchange, the apparatus forming part of a telecommunication system which (A) comprises
   (1) the telecommunication apparatus;
   (2) a DC power source at the exchange;
   (3) a pair of wires connecting the power source and the telecommunication apparatus;
   (4) a first PTC device which is in series with apparatus in oen of said pair of wires and is at said remote location;
   (5) a second PTC device which is in series with the apparatus in the other of said pair of wires and is at said remote location;
   (6) a control device which is at said remote location; which is in parallel with the apparatus and the first and second PTC devices; and which will pass DC in one direction only and is connected so that it will not pass current from said power source; and (7) a resistor which is at said remote location; which is in series with the control device and in parallel with the apparatus and the first and second PTC devices; and which is in thermal contact with the first and second PTC devices; and (B) in its normal operating condition is in a first steady state in which (a) no current flows through the control device and the resistor in series therewith and (b) the first and second devices are in a low temperature low resistance state;

which method comprises:

(1) disconnecting said power source; and
(2) inserting a new power source of opposite polarity, whereby current flows through said resistor and heat generated by $I^2R$ heating of the resistor converts the first and second PTC resistors to the high temperature, high resistance state, and the system reaches a second steady state in which substantially no current passes through the apparatus.

BRIEF DESCRIPTION OF THE DRAWINGS

The invention is illustrated in the accompanying drawings in which FIGS. 1 to 6 illustrate circuits of the invention.

DETAILED DESCRIPTION OF THE INVENTION

The new electrical system can be converted between the first and second steady states by an appropriate change in the power source and/or the physical environment of the control device. Thus if the system is in the first state, it can be converted to the second state and then back to the first state; and if it is in the second state, it can be converted to the first state and then back to the second state. Generally the system will have a normal operating condition in which it is in the first or second state (the first state being the more usual) and an abnormal condition, for example a fault or test condition, in which it is in the other state. In some cases the change from one state to the other can be reversed simply by allowing the electrical and physical environments of the control device to return to their original condition, while in other cases a different change or sequence of changes may be needed; for example when a PTC temperature-sensitive device has been converted into a "latched" high temperature high resistance state, it may be necessary to disconnect the PTC device completely, and allow it to cool, before reconnecting it to a power supply.

The control device should of course be selected to respond to the change in electrical or physical conditions which is to cause the system to change from one steady state to the other. The term "changing the power source in the system" is used in a broad sense to include:

(a) disconnection of a first power source and connection to a second power source which differs from the first power source in its voltage, polarity (DC only) or frequency, amplitude or phase (AC only) or two or more of these, for example the replacement of a DC source by another DC source of opposite polarity and higher voltage; and (b) introduction of a second power source (which may be a directly connected power source or an induced power source) in addition to the first power source, for example (i) the accidental or intentional introduction of a mains voltage (e.g. 110, 220 or 440 volts AC) into a system normally powered by a DC source, e.g. of up to 60 volts, or (ii) the introduction of a new electrical signal (or modification of an existing signal) to the biassing means of a control device whose resistance is dependent on the signal fed to such biassing means, e.g. a triac.

It should be noted that the system is defined as one that can be converted between the first and second states by changing the power source or the physical environment of the control device and that the invention therefore includes systems in which the change is caused by a modification of the system which does not involve a change in the power supply but which has the same effect on the control device, for example the shorting out of a large resistance which greatly increases the voltage applied to the control device.

The term "changing the physical environment of the control device" is also used in a broad sense and includes, for example, a change in the temperature of the device, the pressure exerted on the device, the speed (including rotational speed) of the device or the electrical or magnetic field around the device.

Particular examples of control devices which can be used in this invention include diodes, Zener diodes, transistors, triacs, thyristors, NTC devices, PTC devices, capacitors, inductors and inertial and rotational switches. The term "control device is used to include two or more components whch together have the desired electrical characteristics, e.g. a capacitor and inductor in series and having a characteristic resonant frequency.

The temperature-sensitive device used in this invention comprises a PTC or NTC element. Generally the device will be a PTC device which comprises a PTC element and exhibits PTC behavior, and which is, therefore, in a low temperature low resistance state when the system is in its first steady state and the load is activated; the PTC element is preferably composed of a conductive polymer composition, but ceramic PTC materials can also be used. PTC temperature-sensitive devices can be used with a wide variety of control devices whose resistance can be reduced by an appropriate change in the power source in the system or in the physical environment of the control device. The change may be one which simultaneously decreases the resistance of the control device and increases the resistance of the PTC device. For example in one embodiment the control device is a thyristor such that an appropriate increase in the voltage of the power source will both break down the thyristor and, by increasing the current through the PTC device, cause it to be converted to the high temperature high resistance state; in another embodiment the control device is an NTC device, and an appropriate increase in the ambient temperature of the PTC device and the NTC device causes the system to change from the first steady state to the second steady state. In many cases, however, it is useful to place a resistor in series with the control device (and in parallel with the PTC device and the load) and in thermal contact with the PTC device, so that when the control device is converted to the low resistance state and current (or increased current) flows through the resistor, resistive heating of the resistor causes or assists in conversion of the PTC device to a high temperature high resistance state. The resistor may be of fixed resistance or it can exhibit PTC behavior. Use of a PTC resistor is preferred when the system is converted from the first to the second state by changing the power source and the current which initially passes through the resistor may be rather low. When a PTC resistor is used, it preferably has a switching temperature higher than the PTC device(s) thermally coupled to it, e.g. 10° to 150° C. higher.

There can be two or more temperature-sensitive devices in series with the load (and in parallel with the control device) and when there is a resistor in series with the control device, one or more, but preferably all, of the temperature-sensitive devices can be in thermal contact with the resistor. The use of one temperature-sensitive device either side of the load is desirable in systems in which the two legs of the circuit to the load should be balanced when the system is in the first state. For example when, as in a preferred embodiment of the invention, the novel circuit is part of a telecommunication system (the load then being a telephone or other piece of telecommunication apparatus), it is preferred, in order to maintain a balanced circuit under normal operating conditions, that one leg of the circuit should contain a PTC temperature-sensitive device and the other leg of the circuit should contain another resistor which under normal conditions of operation has the same resistance as the PTC device, preferably a second PTC device which is electrically identical at least under normal operating conditions.

The load in the circuits of the invention will generally be a resistive load, but can be in whole or in part an inductive or capacitative load.

The resistance of the control device will generally be decreased by a factor of at least 10, preferably at least 100, when the system is converted from the first steady state to the second steady state. The resistance of the (or each) temperature-sensitive device will generally be increased by a factor of at least 10, preferably at least 100, when the system is converted from the first steady state to the second steady state. In the first steady state, the resistance of the control device will generally be at least 10 times, preferably at least 100 times, the resistance of the temperature-sensitive device(s), while the current through the load will generally be at least 10 times, preferably at least 100 times the current through the control device. In the second steady state, the resistance of the temperature-sensitive device(s) will generally be at least 10 times, preferably at least 100 times, the resistance of the control device, while the current through the control device will be at least 10 times, preferably at least 100 times the current through the load.

The invention is illustrated in the accompanying drawings, in which each of the Figures shows an electrical system according to the invention. In each of the Figures, the arrows on the circuit itself show the current when the system is in the first steady state, and the adjacent dotted arrows show the current when the system is in the second steady state. Each system comprises a control device 1, a temperature-sensitive device 2, a power source 3 and a load $R_L$. FIGS. 2, 3, 5 and 6 also include a resistor 4 in series with the control device. Although not indicated in the Figures, the power source will usually be physically remote from the other components.

Referring now to FIG. 1, the control device 1 is a gas discharge tube and the temperature-sensitive device 2 is an NTC device. Under normal operating conditions, the system is in the first steady state, the voltage of the normal power supply being too low to break down the gas discharge tube and the current through the NTC device 2 being high enough to maintain it in the high temperature low resistance state. When the normal power supply is replaced by a second power supply of substantially higher voltage, the gas discharge tube breaks down and conducts, and the current through the NTC device drops so that the NTC device is converted to the low temperature high resistance state. The system then reaches the second steady state, in which the current through $R_L$ is very low. In an example of a circuit of this kind, the load might be a piece of apparatus having a resistance of about 50 ohms, the normal power supply about 50 volts AC and the second power supply about 200 volts AC, the gas discharge tube an arc discharge tube having a voltage across it in the second state of about 1 volt and the NTC device a conductive polymer device having a resistance of about 1 ohm in the first state and about 1000 ohms in the second state. If desired, a resistor can be placed in series with the power supply.

Referring now to FIG. 2, the control device 1 is a diode which will pass DC in one direction only, the temperature-sensitive device 2 is a PTC device and there is a fixed resistor 4 which is in series with the diode and is in thermal contact with the PTC device 2. Under normal operating conditions the system is in the first steady state, the normal power source being DC of polarity such that no current flows through the diode and of voltage such that the current through the PTC device is insufficient to convert it to the high resistance state. When the normal power supply is replaced by a second DC power supply of opposite polarity, current flows through the diode and the resistor 4, which is heated by $I^2R$ heating. Heat transfer from the resistor 4 to the PTC device 2 converts the PTC device to the high resistance state. The system then reaches the second state, in which the current through $R_L$ is very low. In an example of a circuit of this kind, the load might be a piece of apparatus having a resistance of about 50 ohms, the normal power supply about 50 volts DC of one polarity and the second power supply of about 50 volts DC of the opposite polarity, the resistance of fixed resistor 4 about 1000 ohms, and the PTC device 2 a conductive polymer device having a resistance of about 0.1 ohm in the first state and about 100,000 ohms, in the second state.

The system shown in FIG. 3 is the same as that in FIG. 2 except that there are two identical PTC devices 2 in series with $R_L$, and operates in the same way except that when the second power source is connected, both the PTC devices 2 are heated by thermal transfer from the resistor 4 and are converted to the high resistance state. This system is particularly suitable for use in a telecommunication system, $R_L$ being a piece of telecommunication apparatus, e.g a telephone having a resistance of about 50 ohms, which can be remotely disconnected by changing the power supply at the exchange, so that the telephone lines can be tested independently of the telephone. Such testing can be carried out using the second power source or the second power source can be replaced by a third power source for testing purposes. If a third power source is used, it need not be one which will maintain the PTC devices in the high resistance state, since there will be a finite delay before the PTC devices cool to a low resistance state and the telecommunication apparatus will be isolated during that delay period. Thus it is possible at least during the delay period to use a DC source of the same polarity as the first power source (or the first power source itself) for testing purposes if the test is to be carried out on the open lines. Furthermore, if the PTC devices are "latched" in the high resistance state, and the third power source results in a current through the PTC devices which is sufficient to maintain them in the latched condition (which may be less than the current through them in the second steady state), then the load will remain effectively isolated.

Referring now to FIG. 4, the control device 1 is a PTC resistor and the temperature-sensitive device 2 is an NTC resistor. Under normal operating conditions the system is in the second steady state, the ambient temperature of the PTC and NTC resistors being such that the PTC resistor has a low resistance and the NTC resistor has a high resistance. By increasing the ambient temperature the PTC resistor is converted to a high resistance state and the NTC resistor is converted to the low resistance state, and the system reaches the first steady state. In an example of a circuit of this kind, the load might be a piece of apparatus having a resistance of about 100 ohms, the power supply an AC or DC source of about 50 volts, the PTC resistor a conductive polymer device having a resistance in the first state of about 100,000 ohms and in the second state of about 0.1 ohm, and the NTC resistor a conductive polymer device having a resistance in the first state of about 1 ohm and in the second state of about 1000 ohms.

Referring now to FIG. 5, this illustrates a circuit which provides for disconnection of a load from a power supply when there is an imbalance in the lines from the power supply to the load. The control device 1 is a triac, there are two temperature-sensitive devices 2, each of which is a PTC device, and there is a PTC resistor 4 which is in series with the triac and in thermal contact with each of the PTC devices 2. The switching temperatures of the PTC devices 2 is lower than the switching temperature of the PTC resistor 4. The system also includes a toroid loop 5 of conventional design which surrounds the lines 10 and 11 leading to the load $R_L$ and which will generate a signal if the lines are not balanced. This signal is passed through an amplifier 6 onto the gate of the triac 1, causing it to open if there is an imbalance in the lines 10 and 11, caused for example by a ground fault. Thus if lines 10 and 11 are in balance the triac will be closed and the system will be in the first steady state. However, if the lines become unbalanced, the triac will open, causing current to flow through the PTC resistor 4, and the heat generated by $I^2R$ heating of the resistor 4 will be transferred to the PTC devices 2, causing them to assume a high resistance state. The system then reaches the second steady state. In an example of a circuit of this kind, the load might be a piece of apparatus having a resistance of about 10 ohms, the power supply an AC or DC source of about 115 volts, the PTC devices 2 conductive polymer devices having a switching temperature of about 100° C., a resistance of about 0.05 ohm in the first state and about 100,000 ohms in the second state, and the PTC device 4 a conductive polymer device having a switching temperature of about 125° C., a resistance of about 1 ohm in the first state and about 100,000 ohm in the second state.

Referring now to FIG. 6, the control device 1 is a series resonant device comprising an inductor 1A and a capacitor 1B in series therewith, the temperature-sensitive device is a PTC device, and there is a fixed resistor 4 which is in series with the control device and which is thermally coupled to the PTC device 2. When the power source is DC of voltage such that the PTC device is in the low temperature low resistance state, the system is in the first state. If an AC voltage, having a frequency which coincides with the resonant frequency of the device 1, is superimposed on the DC power source, then current will pass through the resistor 4, which is heated by $I^2R$ heating. Heat transfer from resistor 4 to PTC device 2 converts the PTC device 2 to the high resistance state. The system then reaches the second state in which the current through $R_L$ is very low. In the system shown in FIG. 6, an amplifier can be placed between the control device 1 and the resistor 4. A plurality of LC circuits can be incorporated in the system of FIG. 6, as indicated by the arrows, the LC circuits having different resonant frequencies. In this case, any one or more of the loads in the different LC circuits can be connected or disconnected by superimposing one or more AC voltages of appropriate frequencies.

We claim:
1. An electrical circuit which comprises:
   (1) a temperature-sensitive device which comprises one of the following:
      (a) a PTC element;
      (b) an NTC element;
   (2) a load in series with the temperature-sensitive device; and
   (3) a control device which:
      (a) is in parallel with the temperature-sensitive device and the load, and
      (b) has a resistance which can be interchanged between a relatively high level and a relatively low level;
   the temperature-sensitive device, load and control device being connectable to a source of electrical power to form an electrical system which
      (A) can adopt one of two steady states, namely:
         (a) a first state in which the resistance of the control device is at said relatively high level and is substantially higher than the resistance of the temperature-sensitive device and the temperature-sensitive device is in a low resistance state, and
         (b) a second state in which the resistance of the control device is at said relatively low level and is substantially lower than the resistance of the temperature-sensitive device and the temperature-sensitive device is in a high resistance state; and
      (B) can be converted between the first and second states by changing at least one of the following: (i) the power source in the system, and (ii) the physical environment of the control device.

2. A circuit according to claim 1 wherein the temperature-sensitive device is a PTC device which comprises a PTC element and exhibits PTC behavior.

3. A circuit according to claim 2 wherein the temperature-sensitive device comprises a PTC element comprising a polymer having electrically conductive particles dispersed therein.

4. A circuit according to claim 2 which comprises a resistor which is in series with the control device, the series circuit comprising the resistor and the control device being in parallel with the series circuit comprising the PTC device and the load, and the resistor being in thermal contact with the PTC device, whereby during conversion of said system from the first state to the second state, resistive heating of the resistor causes or assists in conversion of the PTC device to a high temperature high resistance state.

5. A circuit according to claim 4 comprising two PTC devices, each of which is in series with the load, the series circuit comprising the PTC devices and the load being in parallel with the series circuit comprising the control device and the resistor and each of the PTC devices being in thermal contact with the resistor, the load being between the two PTC devices.

6. A circuit according to claim 5 which is part of a telecommunications system, and in which (i) the load comprises telecommunication apparatus; (ii) the PTC devices are electrically substantially identical when the system is in the first state; (iii) one of the PTC devices is in one of the legs of the system and the other of the PTC devices is in the other of the legs of the system; and (iv) the control device and the PTC devices are in physical proximity to the telecommunication apparatus.

7. A circuit according to claim 6 wherein the control device will pass DC in one direction only.

8. A circuit according to claim 6 wherein the control device is a device whose resistance depends upon an electrical signal which is fed to biassing means in the device and which is generated by a device which detects a fault in the system.

9. A circuit according to claim 6 wherein the control device has a substantially higher resistance to a lower voltage than it does to a higher votage.

10. An electrical system which comprises:
  (1) a temperature-sensitive device which comprises one of the following:
    (a) a PTC element;
    (b) an NTC element:
  (2) a load in series with the temperature-sensitive device;
  (3) a control device which;
    (a) is in parallel with the temperature-sensitive device and the load, and
    (b) has a resistance which can be interchanged between a relatively high level to a relatively low level;
  (4) a source of electrical power;
the components of the electrical system being arranged so that the system
  (A) can adopt one of two steady states, namely:
    (a) a first state in which the resistance of the control device is at said relatively high level and is substantially higher than the resistance of the temperature-sensitive device and the temperature-sensitive device is in a low resistance state, and
    (b) a second state in which the resistance of the control device is at said relatively low level and is substantially lower than the resistance of the temperature-sensitive device and the temperature-sensitive device is in a high resistance state; and
  (B) can be converted between the first and second states by changing at least one of the following: (i) the power source in the system, and (ii) the physical environment of the control device.

11. A system according to claim 10 wherein the temperature-sensitive device is a PTC device which comprises a PTC element and exhibits PTC behavior.

12. A system according to claim 11 wherein the control device will pass DC in one direction only and the power source is a source of DC of polarity such that there is no current through the control device, whereby the circuit is in the first steady state and can be converted to the second steady state by replacing the power source by a second DC power source of opposite polarity.

13. A system according to claim 11 wherein the control device is a device whose resistance depends upon an electrical signal which is fed to biassing means in the device, whereby the system can be converted between the first and second states by changing the signal which is fed to the device.

14. A system according to claim 11 wherein the control device has a substantially higher resistance to a lower voltage than it does to a higher voltage, whereby the system can be converted between the first and second states by increasing the voltage over the device.

15. A system according to claim 11 which is a telecommunications system having first and second legs and in which
  (i) the load comprises telecommunication apparatus and
  (ii) the temperature-sensitive device comprises a first PTC device in the first leg of the system and a second PTC device in the second leg of the system, the PTC devices being in physical proximity to the telecommunication apparatus and being electrically substantially identical when the system is in the first state,
the system further comprising a resistor which is in series with the control device, the series circuit comprising the resistor and the control device being in parallel with the series circuit comprising the PTC devices and the load, and the resistor being in thermal contact with the PTC devices; whereby during conversion of the system from the first state to the second state, resistive heating of the resistor causes or assists in conversion of the PTC devices to a high temperature high resistance state.

16. A system according to claim 15 wherein the control device is a diode.

17. A system according to claim 15 wherein the control device is a triac which can be opened and closed by a signal from a device which detects a fault in the system.

18. A method of remotely disconnecting telecommunication apparatus located at a location which is remote from an exchange, the apparatus forming part of a telecommunication system which:
  (A) comprises:
    (1) the telecommunication apparatus
    (2) a DC power source at the exchange;
    (3) a pair of wires connecting the power source and the telecommunication apparatus;
    (4) a first PTC device which is in series with apparatus in one of said pair of wires and is at said remote location;
    (5) a second PTC device which is in series with the apparatus in the other of said pair of wires and is at said remote location;
    (6) a control device which is at said remote location; which is in parallel with the apparatus and the first and second PTC devices; and which will pass DC in one direction only and is connected so that it will not pass current from said power source; and
    (7) a resistor which is at said remote location; which is in series with the control device the series circuit comprising the resistor and the control device being in parallel with the series circuit comprising the apparatus and the first and second PTC devices; and the resistor being in thermal contact with the first and second PTC devices; and (B) in its normal operating condition is in a first steady state in which (a) no current flows through the control device and the resistor in series therewith and (b) the first and second devices are in a low temperature low resistance state;

which method comprises:

(1) disconnecting said power source; and (2) inserting a new power source of opposite polarity, whereby current flows through said resistor and heat generated by $I^2R$ heating of the resistor converts the first and second PTC resistors to the high resistance state, and the system reaches a second steady state in which substantially no current passes through the apparatus.

19. A method according to claim 18 wherein the new power source is of higher voltage than the normal power source.

20. A method according to claim 18 wherein the first and second PTC devices are substantially identical.

* * * * *